United States Patent
Gardes et al.

(10) Patent No.: US 9,343,638 B2
(45) Date of Patent: May 17, 2016

(54) ELECTRO-OPTIC PN JUNCTION MODULATOR FORMED WITH A SELF-ALIGNED PROCESS

(75) Inventors: Frederic Gardes, Guildford (GB);
David Thomson, Ash Vale (GB);
Graham Reed, Godalming (GB)

(73) Assignee: University of Southampton, Southampton (GB)

( * ) Notice: Subject to any disclaimer, the term of this patent is extended or adjusted under 35 U.S.C. 154(b) by 0 days.

(21) Appl. No.: 13/578,837

(22) PCT Filed: Feb. 17, 2011

(86) PCT No.: PCT/GB2011/000216
§ 371 (c)(1),
(2), (4) Date: Oct. 15, 2012

(87) PCT Pub. No.: WO2011/101632
PCT Pub. Date: Aug. 25, 2011

(65) Prior Publication Data
US 2013/0188902 A1 Jul. 25, 2013

(30) Foreign Application Priority Data
Feb. 17, 2010 (GB) .................................. 1002726.6

(51) Int. Cl.
| | | |
|---|---|---|
| *G02F 1/035* | (2006.01) |
| *G02B 6/12* | (2006.01) |
| *H01L 33/58* | (2010.01) |
| *G02F 1/35* | (2006.01) |
| *G02F 1/29* | (2006.01) |
| *G02F 1/025* | (2006.01) |
| *G02F 1/21* | (2006.01) |
| *G02F 1/015* | (2006.01) |

(52) U.S. Cl.
CPC ............... *H01L 33/58* (2013.01); *G02F 1/025* (2013.01); *G02F 1/29* (2013.01); *G02F 1/35* (2013.01); *G02F 1/218* (2013.01); *G02F 2001/0152* (2013.01); *G02F 2001/212* (2013.01)

(58) Field of Classification Search
CPC ............... G02F 1/01; G02F 1/29; G02F 1/35; G02F 1/025; H01S 5/00
USPC .......................................... 385/2, 12, 14, 131
See application file for complete search history.

(56) References Cited

U.S. PATENT DOCUMENTS

| | | | | |
|---|---|---|---|---|
| 5,717,707 | A * | 2/1998 | Beernink et al. | 372/46.016 |
| 7,116,853 | B2 * | 10/2006 | Gunn et al. | 385/14 |
| 7,187,837 | B2 * | 3/2007 | Gothoskar et al. | 385/131 |
| 8,149,493 | B2 * | 4/2012 | Chen | 359/250 |

(Continued)

FOREIGN PATENT DOCUMENTS

JP          01191472 A  *  8/1989

*Primary Examiner* — Charlie Peng
(74) *Attorney, Agent, or Firm* — Nadya Reingand

(57) ABSTRACT

An electro-optic device, comprising a layer of light-carrying material; and a rib, projecting from the layer of light-carrying material, for guiding optical signals propagating through the device. The layer of light-carrying material comprises a first doped region of a first type extending into the rib, and a second doped region of a second, different type extending into the rib such that a pn junction is formed within the rib. The pn junction extends substantially parallel to at least two contiguous faces of the rib, resulting in a more efficient device. In addition, a self-aligned fabrication process can be used in order to simplify the fabrication process and increase reliability and yield.

18 Claims, 9 Drawing Sheets

(56) References Cited

U.S. PATENT DOCUMENTS

2004/0208454 A1* 10/2004 Montgomery et al. ......... 385/50
2010/0060970 A1* 3/2010 Chen ............................ 359/245
2010/0080504 A1* 4/2010 Shetrit et al. .................... 385/14
2010/0215309 A1* 8/2010 Shubin et al. ..................... 385/3
2012/0003767 A1* 1/2012 Fujikata et al. ................. 438/31

* cited by examiner

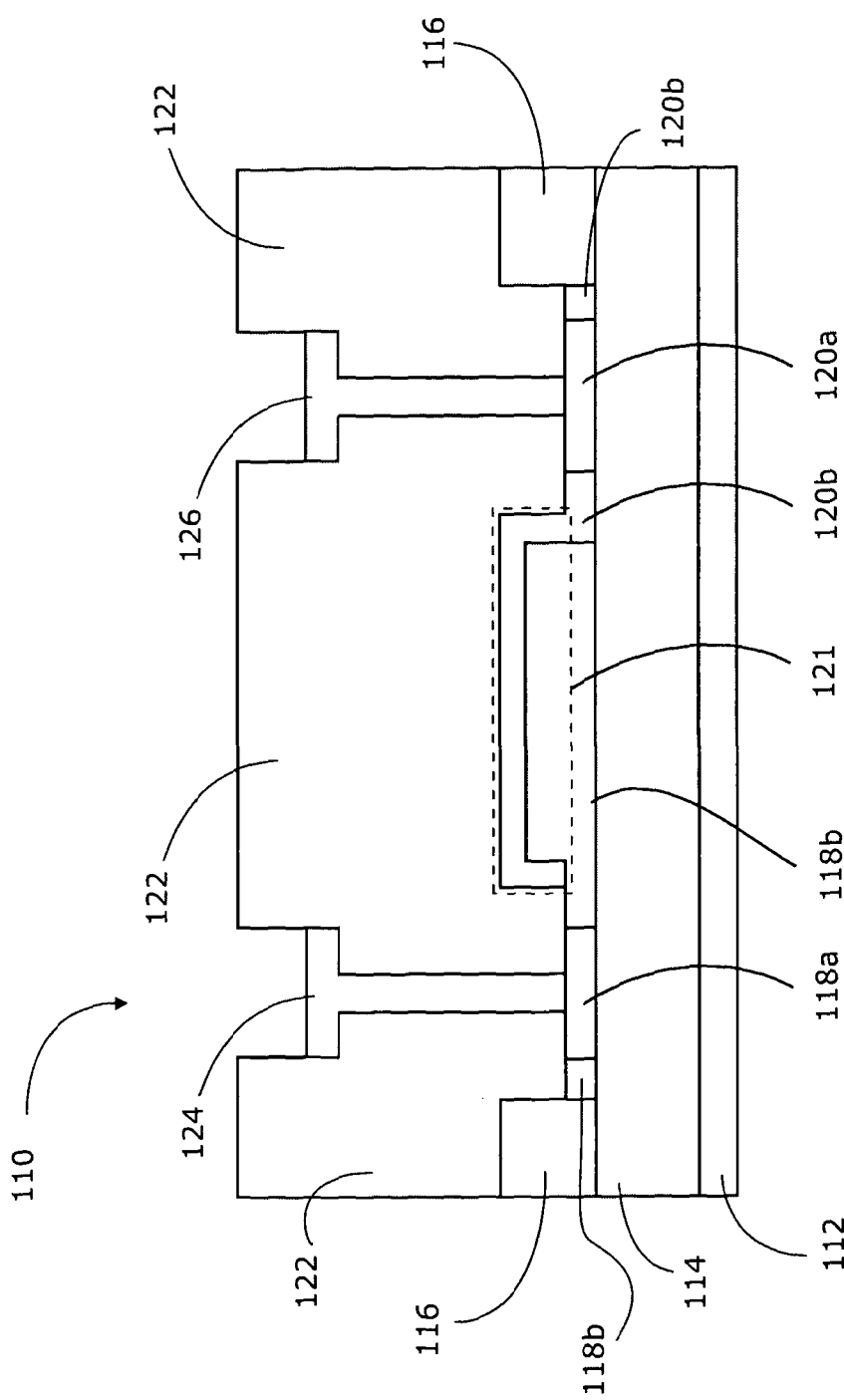

ELECTRO-OPTIC PN JUNCTION MODULATOR FORMED WITH A SELF-ALIGNED PROCESS

CROSS-REFERENCE TO RELATED APPLICATIONS

This patent application claims priority to Great Britain application GB1002726.6 filed Feb. 17, 2010 and to PCT application PCT/GB2011/000216 filed Feb. 17, 2011.

FIELD OF THE INVENTION

The present invention relates to the field of electro-optics, and particularly to electro-optic devices comprising a waveguide rib and methods for the fabrication thereof.

BACKGROUND ART

Silicon microphotonics has generated an increasing interest in recent years. Integrating optics and electronics on the same chip would allow enhancement of integrated circuit (IC) performance. Furthermore, telecommunications could benefit from the development of low cost solutions for high-speed optical links. The realization of active photonic devices, in particular high speed optical modulators integrated in silicon-on-insulator (SOI) waveguides, is essential for the development of silicon microphotonics/nanophotonics.

Although silicon does not in normal circumstances exhibit a linear electro-optic (Pockels) effect, other mechanisms are available for modulation, including thermo-optic and plasma dispersion effects. Aside from these, further interesting methods have been reported which include using strain to introduce a Pockels effect, forming SiGe/Ge quantum wells to take advantage of the quantum-confined stark effect, and bonding III-V materials to make use of their stronger electro-optic properties. The disadvantage of these approaches is the complex or non-CMOS compatible fabrication processes involved. The thermo-optic effect in silicon is relatively, very slow and therefore has no real use for high speed applications. The plasma dispersion effect on the other hand is much more promising with most of the recent successful high-speed silicon modulators being based upon this effect, whilst using carrier injection, depletion or accumulation to cause the required changes in free-carrier concentration.

The plasma dispersion effect uses changes in the free-carrier concentration to cause modulation of the light passing through the device. The free-carrier concentration may be changed by injecting carriers into the device, depleting carriers from a region of the device or by causing an accumulation of charge carriers in a region of the device. Carrier injection is typically carried out in a PIN diode structure with the optical waveguide passing though the intrinsic region. When the diode is forward biased, carriers pass into the intrinsic region causing a change in refractive index. Carrier depletion can be based upon a PN junction diode in the waveguide. Reverse biasing the diode causes carriers to be swept out of part or all of the waveguide region, again resulting in a change in refractive index. Carrier accumulation involves the use of an insulating layer between P and N diode regions that will, when biased, cause an accumulation of free carriers on the edges of the layer, much like a capacitor. Carrier depletion and accumulation, unlike carrier injection, are not limited by the relatively long minority carrier lifetime in silicon and consequently the fastest reported devices have utilised these mechanisms.

The figures of merit for classifying optical modulators are as follows:
Electro-optic bandwidth: this indicates the high-speed cut off frequency and can be used to predict data transmission rates in the absence of an eye diagram.
Data transmission rate: this indicates the rate at which data can be transmitted, with 5 Gb/s, 10 Gb/s or 40 Gb/s normally being targeted.
Dynamic extinction ratio: this gives the difference between the modulators on and off power levels at a specified data rate. A large extinction ratio will allow for longer transmission lengths before data restoration is required.
Optical insertion loss.
DC extinction ratio: this indicates the low speed difference in on and off power levels.
$V\pi L\pi$ efficiency: since devices produce phase modulation which is later converted to intensity modulation, this describes the voltage-length product required to produce a $\pi$ radian phase shift.
Size.
Power efficiency.

Other than these quantifiable factors, however, it is also important to consider the ease of fabrication and expected tolerances in device performance caused by slight variations inherent in the fabrication processes used, as these can have a direct effect on production cost and device yield. Existing devices have improved the data transmission rate and $V\pi L\pi$ efficiency, but are not always practical for mass production due to their complex structure.

SUMMARY OF THE INVENTION

It is therefore an object of the present invention to provide an electro-optic device, such as an electro-optical modulator, that is relatively simpler and easier to produce than existing devices, but nonetheless provides strong performance in terms of the quantifiable factors listed above.

In one aspect, the present invention provides an electro-optic device, comprising a layer of light-carrying material; and a rib, projecting from the layer of light-carrying material, for guiding optical signals propagating through the device. The layer of light-carrying material comprises a first doped region of a first type extending into the rib, and a second doped region of a second, different type extending into the rib such that a pn junction is formed within the rib, substantially parallel to at least two contiguous faces of the rib.

In one embodiment, the pn junction runs substantially parallel to three faces of the rib.

These structures have the advantage that they allow a self-aligned fabrication process, increasing yield, and the greater surface area of the pn junction increases the efficiency of the device.

Thus, according to another aspect of the present invention, there is provided a method of fabricating an electro-optic device, comprising: depositing a mask over an area of light-carrying material and partially etching parts of the light-carrying material not covered by the mask, to form thereby a layer of light-carrying material and a rib, projecting from the layer of light-carrying material, for guiding optical signals propagating through the device, said area of light-carrying material comprising a first doped region of a first type and a second doped region of a second, different type, at least partially overlaying the first doped region; and doping a side portion of the rib, abutting said mask, with dopants of said second type, such that said second doped region is extended and a pn junction is formed within the rib substantially parallel to at least two contiguous faces of the rib.

As mentioned above, the mask may be used as a guide for both the etching process to define the waveguide rib, and the doping process to form the pn junction within the waveguide rib. Thus the process is self-aligned, resulting in increased yield.

BRIEF DESCRIPTION OF THE DRAWINGS

An embodiment of the present invention will now be described by way of example, with reference to the accompanying figures in which:

FIG. 1 shows an electro-optic device according to embodiments of the present invention;

DETAILED DESCRIPTION OF THE EMBODIMENTS

Figure 2A:
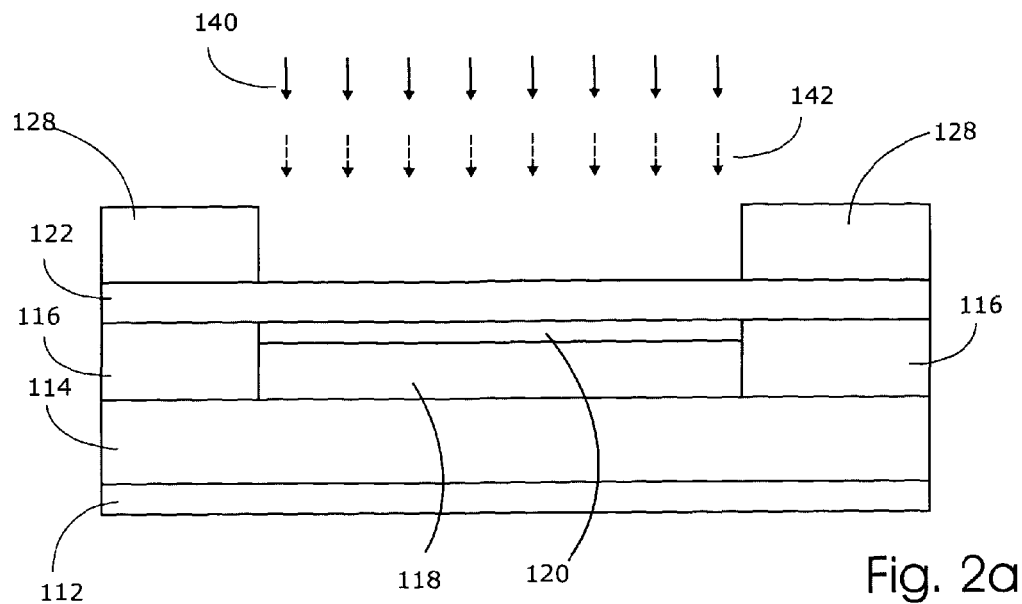
FIGS. 2a to 2h show a method of fabricating the electro-optic device as shown in FIG. 1.

As stated above, conventional silicon electro-optic devices (such as electro-optic modulators) comprise a waveguide portion through which photons are transmitted. In operation, the free carrier concentration of the waveguide portion may be adjusted in order to change its refractive index and control the passage of light through the device. This is usually achieved via a pn or pin junction, or MOS capacitor formed across/in the waveguide. However, the design of conventional devices has been such that their fabrication is difficult to achieve in CMOS processing.

According to embodiments of the present invention, an electro-optic device comprises a layer of light-carrying material, such as silicon, and a rib projecting therefrom. The layer has two doped regions of opposite type, with both doped regions extending into the rib and arranged such that a pn junction is formed which is substantially parallel to at least two faces of the rib. This structure has the advantage that it allows a self-aligned fabrication process, increasing reliability and yield, and the greater area of the pn junction increases the efficiency of the device.

FIG. 1 shows in cross-section an electro-optic modulator 110 according to an embodiment of the present invention (not to scale).

The modulator 110 comprises a substrate 112 and an insulating layer 114 formed thereon. In one embodiment, the substrate is fabricated from silicon and the insulating layer from silicon dioxide; the insulating layer 114 is frequently referred to in the art as a 'buried oxide' layer. However, alternative materials will be apparent to those skilled in the art, such as (but not limited to) silicon on sapphire (where the entire sapphire substrate is insulating), germanium on silicon, and silicon-germanium on insulator.

Above the insulating layer 114 is formed a layer of light-carrying material. In one embodiment, the light-carrying material is silicon and the layer is primarily composed of nominally intrinsic silicon 116. However, formed within the layer are two regions of doped material: a p-type doped region 118 and an n-type doped region 120. The two doped regions 118, 120 abut each other to form a pn junction, as is well known in the art, and the n-type region 118 overlaps the p-type region 120 so that the pn junction is formed both above and to the side of the p-type region. Each region 118, 120 is further divided into two parts. The p-type region 118 comprises a first part 118a of highly doped material (as commonly denoted p+ in the literature), and a second part 118b of relatively sparsely doped material (as commonly denoted p in the literature), that is, sparsely doped relative to the highly doped region 118a. Similarly, the n-type region 120 comprises a first part 120a of highly doped material (as commonly denoted n+ in the literature), and a second part 120b of relatively sparsely doped material (as commonly denoted n in the literature), that is, sparsely doped relative to the highly doped region 120a. The pn junction between the two regions 118, 120 is formed between the relatively sparsely doped regions 118b, 120b. The p- and n-type regions 118b, 120b are typically doped at a concentration of between about $10^{17}$ and $10^{19}$ cm$^{-3}$; and the p+ and n+ regions 118a, 120a doped at a concentration of between about $10^{19}$ and $10^{20}$ cm$^{-3}$, although different concentrations may be used, and the ranges may overlap. It will be appreciated that the terms n and n+ (and similarly p and p+) are used to denote differences in the carrier concentration rather than absolute concentrations. The absolute concentrations may be tailored as desired in order to achieve a certain performance characteristic. An example of a possible p-type dopant is boron, and possible n-type dopants include phosphorus, antimony and arsenic. It should also be noted that the nominally intrinsic regions 116, will typically contain residual dopants and may therefore be lightly doped p-type or lightly doped n-type (typically $10^{15}$ cm$^{-3}$).

The device 110 further comprises a rib 121 (indicated by the dashed line in FIG. 1) for guiding optical signals propagating through the device (in many optical modes photons will also propagate in areas outside the waveguide rib 121). The p-type region 118b comprises a relatively thicker portion that extends into the rib. The n-type region 120b also extends into the rib 121, abutting the p-type region 118b such that a pn junction is formed between them. Nonetheless, a junction may be said to form between the two regions 118b, 120b. According to embodiments of the present invention, the pn junction so formed is arranged to be substantially parallel to at least two contiguous faces of the rib 121. In the illustrated embodiment, the pn junction is substantially parallel to three faces of the rib 121, i.e. the n-type region 120b surrounds the thicker portion of the region 118b such that the pn junction between the two runs substantially parallel to one of the "side" faces, then substantially parallel to the "top" face, and finally parallel to the other "side" face of the rib 121. As will be explained in detail below, this structure lends itself to a particularly simple and reliable fabrication method. In addition, the device 110 is made more efficient by extending the pn junction around more than one face of the rib 121.

A further insulating layer 122 is formed over the light-carrying layer and waveguide rib 121. The further insulating layer 122 may again be fabricated from silicon dioxide. Contacts 124, 126 are formed respectively with the p+ and n+ regions 118a, 120a, by passing conducting material (e.g. metallic materials) through the insulating layer 122. One of the contacts (e.g. contact 124) is connected to a reference voltage such as ground, and the other (e.g. contact 126) is connected to a signal, such that an electric potential difference can be applied to bias the pn junction as desired. It will also be apparent that, if operated in push pull with a modulator in each arm of a Mach-Zehnder interferometer for example, electrical potentials may be applied to both, or neither of the contacts 124, 126. The present invention is not limited to any particular biasing scheme.

The insulating layer 122 is not essential for the device to work, but is used as an upper cladding to both protect the waveguide rib 121 and to passivate the surface so that surface traps which would collect carriers are minimized. In the case of a modulator, it isolates the electrical contact regions 124, 126, and allows connections to the contact to be laid across the top of the insulating layer 122 without affecting other parts of the waveguide. The device would also work with an air cladding, however (i.e. without the insulating layer 122).

FIGS. 2a to 2h show the steps in a method of fabrication of the modulator 110 as shown in FIG. 1. FIG. 3 shows the method in the form of a flowchart.

Figure 3:
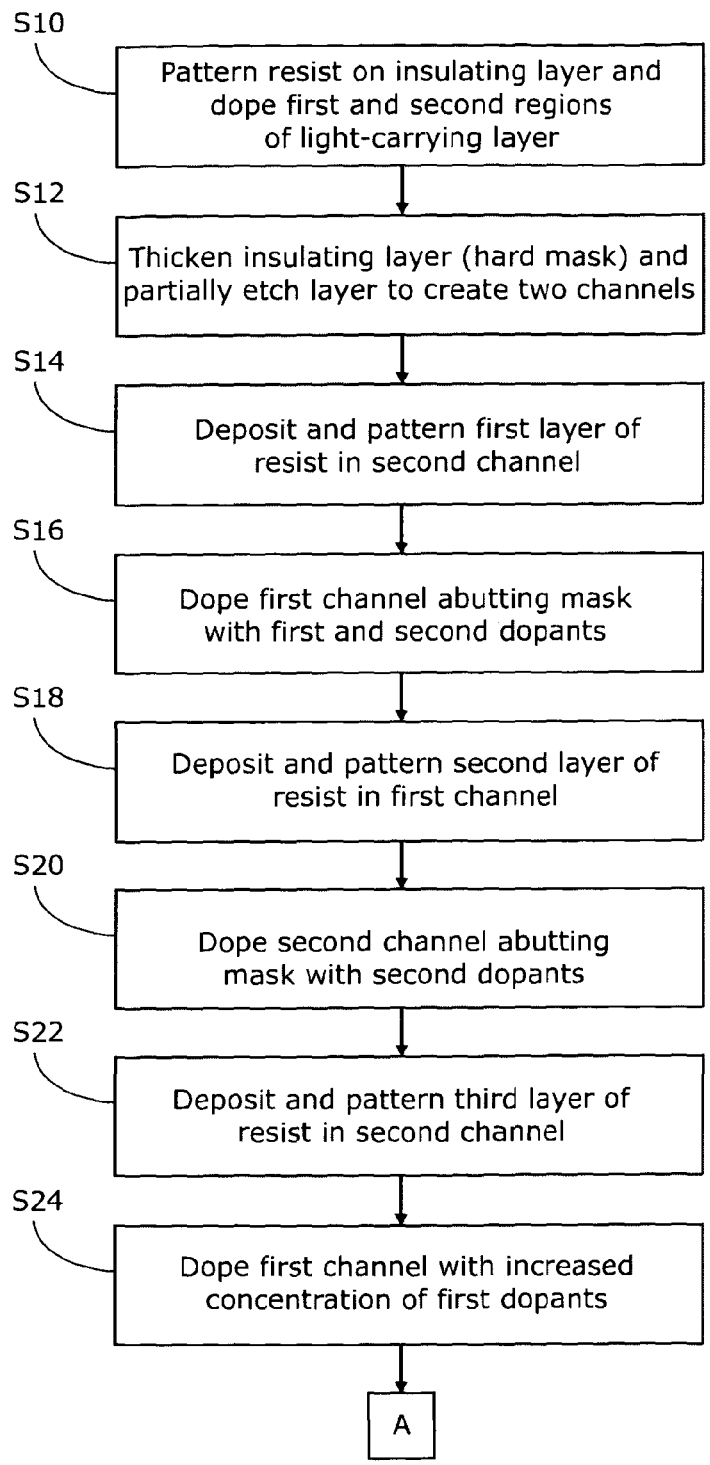
FIG. 3 is a flowchart of a method in accordance with embodiments of the present invention.
Figure 3:
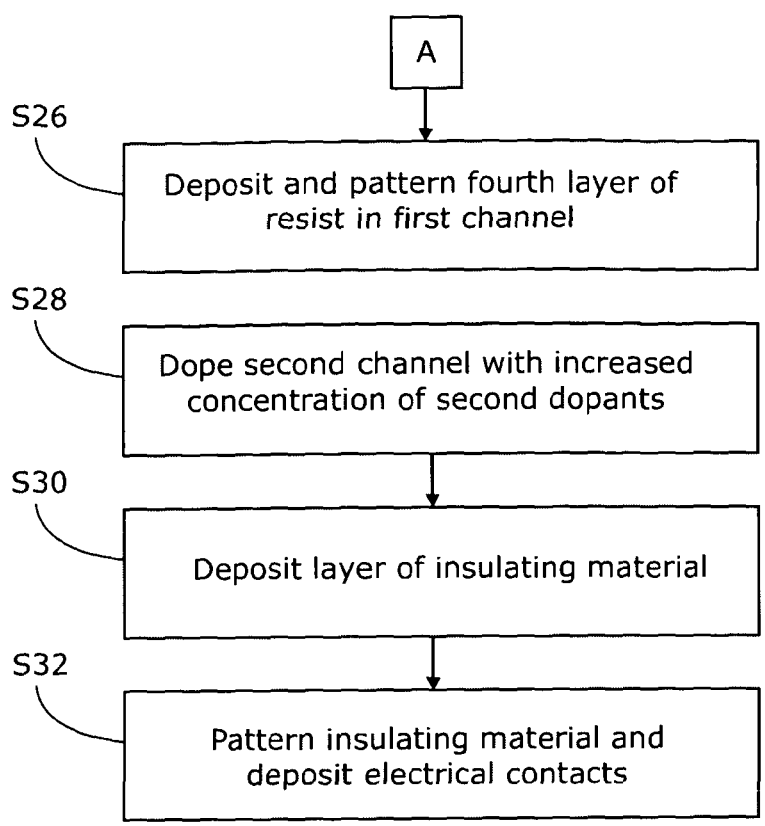

FIG. 2a shows a substrate (e.g. a silicon substrate) 112 covered by a layer 114 of insulating material (e.g. silicon dioxide), with a layer of light-carrying material (e.g. silicon) on the insulator layer 114. Such a combination is commonly referred to as silicon on insulator (SOI), and is readily available. The light-carrying layer is covered by a further layer of insulating material 122 (e.g. silicon dioxide), and a layer of resist 128 is deposited and patterned onto this insulating layer (see step S10, part). The insulating layer 122 is deposited before the doping of the p-type and n-type regions 118, 120 described below, to avoid the roughening of the silicon layer forming the top of the waveguide (in subsequent method steps) that would otherwise occur, leading to increased optical losses. The resist 128 defines a window which is in turn used to define doped regions within the layer of light-carrying material. In the illustrated embodiment, n-type dopants 142 (e.g. phosphorus, antimony or arsenic) are used in the background (at a relatively low energy), and p-type dopants 140 (e.g. boron) are implanted (at a relatively high energy) to generate respectively an upper n-type region 120 and a lower p-type region 118 (see step S10, part). The dopants are deposited into the uncovered region at a concentration of between about $10^{17}$ and about $10^{19}$ cm$^{-3}$, and the remaining resist 128 subsequently removed. The regions 116 of the light-carrying layer covered by the resist 128 are left undoped, i.e. nominally intrinsic (in practice a small number of dopants may be present in these regions through diffusion, for example). In an alternative embodiment, the doped regions 118, 120 may be formed directly in the light-carrying layer, and the insulating layer 122 subsequently deposited over the light-carrying layer.

However, such doping may be achieved in any one of a number of ways that will be familiar to those skilled in the art. Alternative methods include (but are not limited to): epitaxially growing the layer (providing there is a seed layer) with doping ready incorporated (in-situ doping); depositing doped amorphous layers and performing solid phase epitaxial regrowth (providing there is a seed layer); plasma-immersion; and in-diffusion of doping.

Figure 2B:
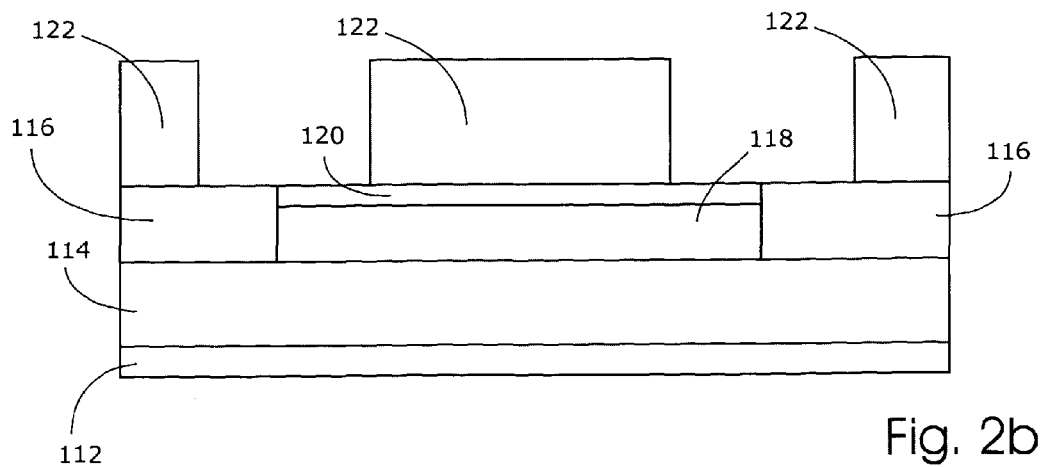

FIG. 2b shows the next stage in which the insulating layer 122 has been thickened, so that subsequent etching processes do not completely remove the layer 122 (see FIG. 2c below). In addition, by thickening the insulating layer 122 at this stage, after doping of the p-type and n-type regions 118, 120, a lower implantation energy may be used in the previous step than would otherwise be the case. It will be apparent to those skilled in the art, however, that the insulating layer 122 may also be deposited in its full thickness in a single step, before or after the doping of the p-type and n-type regions 118, 120.

Two areas of the insulating layer have been etched to define an area where the waveguide rib part of the device is to be formed (see step S12). This structure may be achieved, for example, by depositing and patterning a further layer of resist to leave uncovered two channels either side of the site of the waveguide rib. An etch process may then be used to etch away the insulating layer in those regions.

Figure 2C:
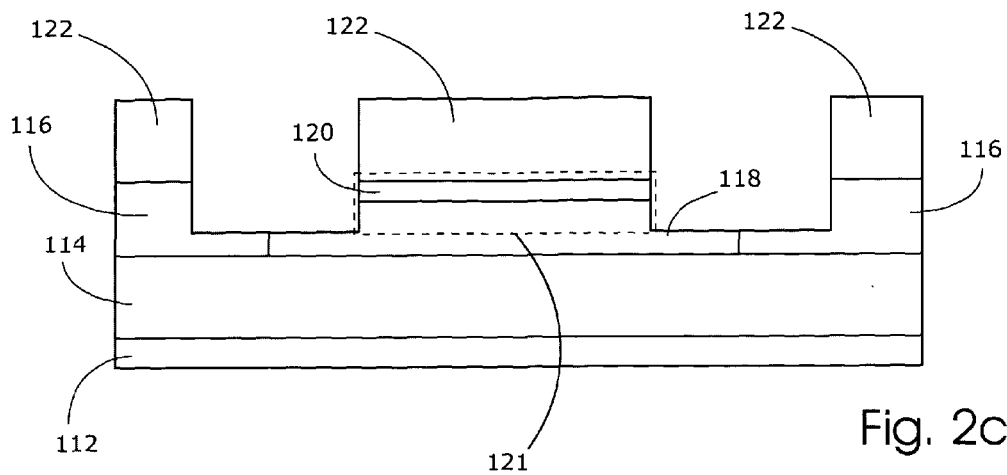

FIG. 2c shows the next stage in the process, in which a further etching process has been used to partially etch away two areas of the light-carrying layer so as to leave a waveguide rib therebetween, leaving relatively thin layers of intrinsic material 116 and p-type material 118 at the bottom of each channel. This process also etches the insulating layer 122, and so the insulating layer 122 is thinner after this step. In between the channels, a relatively thick layer of p-type material is left, and this helps to define the waveguide rib 121 (indicated by dashed lines in FIG. 2c) in combination with a layer of n-type material 120 above.

Figure 2D:
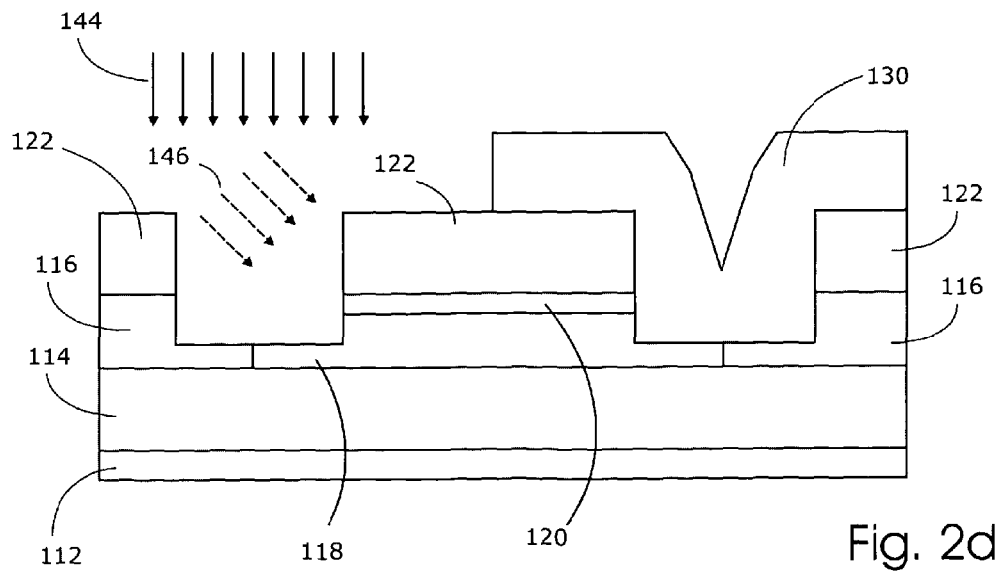

FIG. 2d shows the next stage in the process, where one of the channels has been covered by depositing and patterning a layer of resist 130 (step S14). The other channel is doped with two dopants (step S16). p-type dopants 144 are implanted at an angle substantially perpendicular to the plane of the device, and therefore ensure that the bottom of that channel is of p-type material. That is, the p-type region 118 extends into that channel. n-type dopants 146 are implanted at an angle relative to the p-type dopants 144 towards the waveguide rib 121. It should be noted that the p-type dopants 144 are implanted at a concentration that is high enough not to be compensated for by the n-type dopants 146. In addition, the n-type dopants 146 are implanted with a sufficiently low energy that the p-type region 118 extends continuously from the bottom of the channel into the rib 121, i.e. the p-type region at the bottom of the channel is not separated from the p-type region in the rib 121 by an area of n-type doping.

Figure 2E:
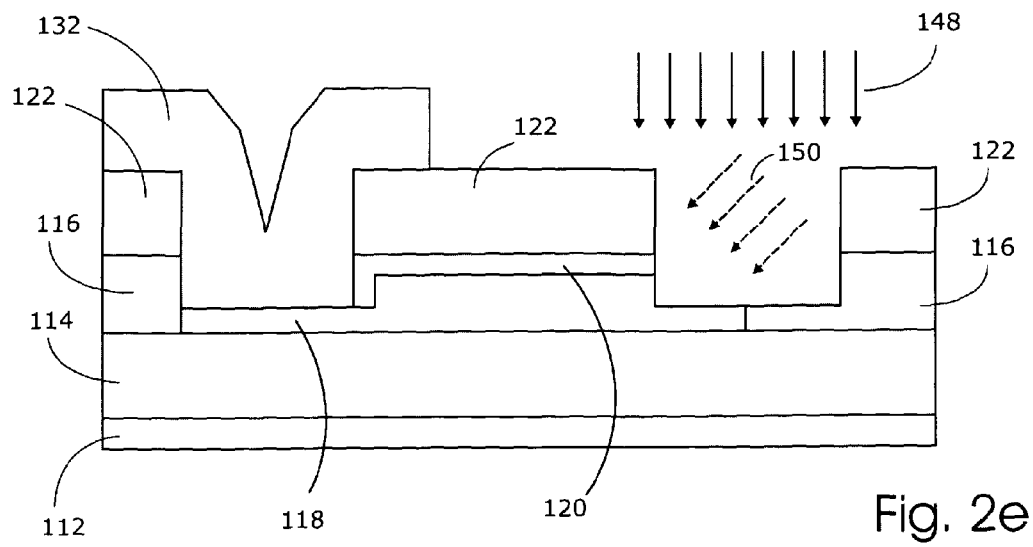

In this way, the side of the waveguide rib 121 is implanted with n-type dopants such that the n-type region 120 extends around the p-type region 118 (see FIG. 2e for the resulting doped regions). The insulating layer 122 is used as part of the mask defining the implantation regions, meaning that the resist 130 may be patterned with a more relaxed tolerance which depends on the width of the waveguide rib (i.e. the dopants 144 and 146 are self aligned by the insulating layer 122).

In an alternative embodiment, the n-type dopants 146 may be omitted from the method. As will be clear from the description below, this embodiment results in a pn junction which runs substantially parallel to just two contiguous faces of the rib, i.e. the "top" face of the rib 121 and just one of the "side" faces.

FIG. 2e shows the next stage in the process, in which similar steps are performed on the second channel. The first channel is covered by depositing and patterning a layer of resist 132 (step S18), and the second channel is implanted with n-type dopants at two angles (step S20): first dopants 148 at an angle substantially perpendicular to the plane of the device, and second dopants 150 at an angle relative to the first dopants 148 towards the waveguide rib 121. The first dopants 148 ensure that the bottom of the second channel is n-type, and the second dopants 150 ensure that the side of the waveguide rib 121 is also n-type, i.e. so that the n-type region 120 extends around the waveguide rib 121 on three faces and into the bottom of the second channel (see FIG. 2f for the finished doped regions). This time, in contrast to the preceding step, dopants 148, 150 are implanted with sufficient energy and concentration that the area between the side of the rib 121 and the bottom of the channel is continuously n-type, i.e. the p-type region is converted to (net) n-type so that the n-type region 120 extends continuously from the bottom of the channel to the side of the rib 121. Dopants 148, 150 can also be replaced by steps of plasma immersion. This process creates a continuous doped region on the side of the rib 121 and the bottom of the second channel in a single step.

Again, it should be noted that the insulating layer 122 is used as part of the mask defining the implantation regions, meaning that the resist 132 may be patterned with a more relaxed tolerance which depends on the width of the waveguide rib (i.e. the dopants 148 and 150 are self aligned by the insulating layer 122).

The above steps therefore show a method of fabricating an electro-optic device 110 in which the pn junction is formed substantially parallel to (up to) three sides of the waveguide rib, increasing efficiency of the device. In addition, the device structure allows the use of a self-aligned fabrication process, increasing device reliability and yield.

Figure 2F:
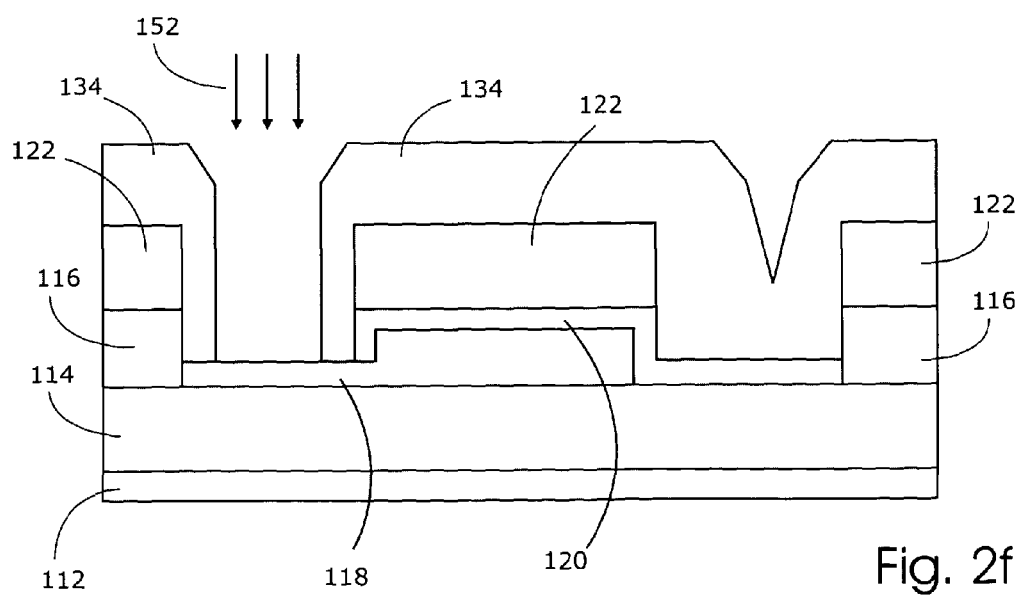
Figure 2G:
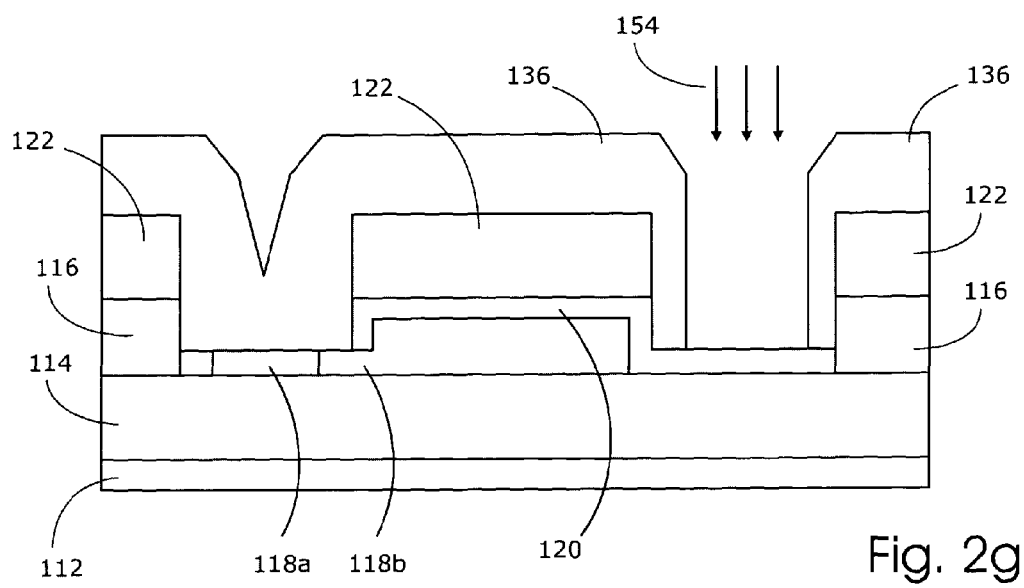

FIGS. 2f and 2g show stages in which n+ and p+ regions are created in the channels, for forming electrical contacts with metallic materials in order to bias the pn junction. In FIG. 2f, a layer of resist 134 is deposited and patterned to define a relatively narrow window within the first channel (step S22). p-type dopants 152 are implanted at a relatively high concentration into this window (e.g. between about $10^{19}$ and $10^{20}$ $cm^{-3}$), to define a p+ region 118a (step S24). The relatively sparsely doped p-type region is denoted 118b. In FIG. 2g, a layer of resist 136 is deposited and patterned to define a relatively narrow window within the second channel (step S26). n-type dopants 154 are implanted at a relatively high concentration into this window (e.g. between about $10^{19}$ and $10^{20}$ $cm^{-3}$), to define an n+ region 120a (step S28). The relatively sparsely doped n-type region is denoted 120b. At any stage after the doped regions have been created, a thermal process may be used to electrically activate the dopants (e.g. a rapid thermal anneal at 1000° C. or higher, for a short period of 15 seconds to limit diffusion of the dopants).

Figure 2H:
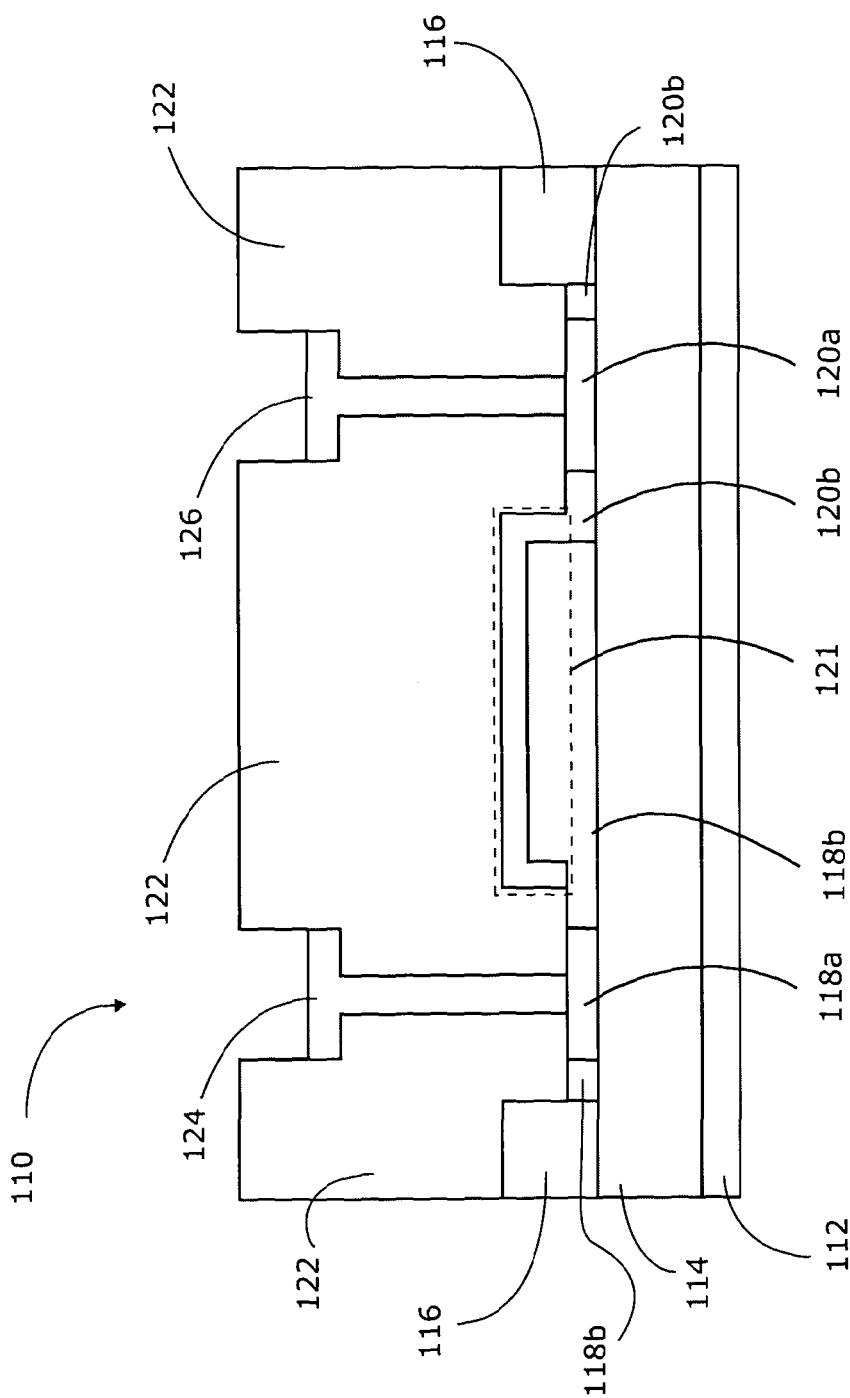

FIG. 2h shows the finished device, in which further insulating material has been deposited over the device to greatly increase the thickness of the insulating layer 122 (step S30). Windows are opened in the oxide on top of the p+ and n+ regions 118a and 120a. A stack of different metals is deposited on top of the wafer and a metal etch is performed to define the electrodes 124, 126 (step S32). The electrodes 124, 126 may be formed using any conducting material, however, and may comprise a single material rather than a stack of materials.

It will be apparent to those skilled in the art that various alterations can be made to the device and method disclosed above without departing from the scope of the invention. For example, the relative positions of the n- and p-type regions may be reversed, i.e. the thicker doped region within the waveguide rib may be formed from n-type material, and the surrounding region from p-type material. Similarly, the steps as set out above need not be performed in the strict order disclosed. For example, steps S14 and S16 may be performed after steps S18 and S20; similarly, steps S22 and S24 may be performed after steps S26 and S28.

In addition, it will also be apparent to those skilled in the art that the depiction of the device in the drawings is idealized for the purposes of clarity. In particular, the drawings tend to show regions with sharply defined boundaries between them, and right-angled corners, etc. In reality, however, the geometry of electro-optic devices on the scale of hundreds of nanometers (as in embodiments of the present invention) is not so precisely defined. For example, the method of doping may be such that the boundaries of the doped regions are more obtuse or transitional than illustrated (for example, implantation results in a distribution of dopants rather than an abrupt interface). Dopants may also diffuse from their starting positions. Adjacent p type and n-type regions may therefore overlap slightly (i.e. an area may have both n-type and p-type dopants), or conversely not be in direct contact. Therefore, the p-type region 118b and the n-type region 120b only "abut" to the extent that a pn junction (and the resulting depletion region) is formed between them. In addition, the rib 121 may not have an exactly rectangular cross-section; instead the faces of the rib may be curved, or otherwise irregular, and the corners thereof may be rounded and may be other than right angles. The use of the hard mask 122 to both define the rib 121 and the doping of regions inside the rib, however, does mean that there will be a change in angle between the sides of the rib and the top of the rib. Thus, the rib can be said to have faces, regardless of whether those faces are curved or flat, and the pn junction found within the rib extends substantially parallel to at least two of those faces.

Figure 4:
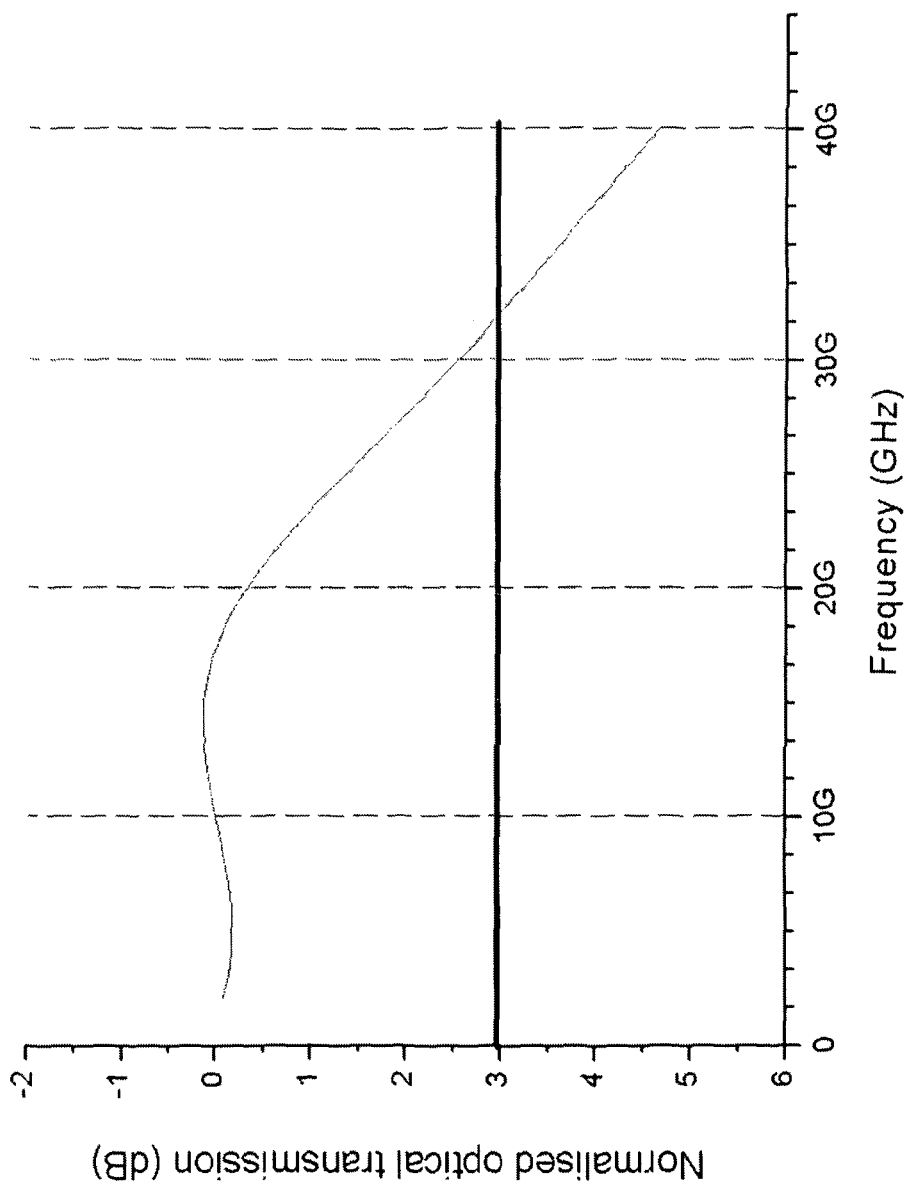
FIG. 4 is a graph of preliminary results for the electro-optic bandwidth of the device shown in FIG. 1.

Simulation results predicted an electro-optic bandwidth above 50 GHz, and preliminary results have demonstrated an electro-optic bandwidth of approximately 32 GHz for a 910 microns long device. This is shown in FIG. 4. Thus it can be seen that good performance is achieved in the device.

There is thus described an electro-optic device comprising a layer of light-carrying material and a rib projecting therefrom. A pn junction formed between oppositely doped regions extending from the layer into the rib runs parallel to at least two faces of the waveguide rib. In this way, the efficiency of the pn junction and the device as a whole is improved. The device structure also lends itself to a self-aligned fabrication process that increases device reliability and yield.

It will of course be understood that many variations may be made to the above-described embodiment without departing from the scope of the present invention. For example, those skilled in the art will appreciate that many of the method steps set out in the application may be performed in an alternative order without departing from the scope of the present invention.

The invention claimed is:

1. An electro-optic device, comprising:
a layer of light-carrying material; and
a rib, projecting from the layer of light-carrying material, for guiding optical signals propagating through the device;
wherein the layer of light-carrying material comprises a first doped region of a first type extending into the rib, and a second doped region of a second, different type extending into the rib such that a pn junction is formed within the rib, substantially parallel to at least three contiguous faces of the rib such that said junction forms a wrap-around π shape in cross-section.

2. The device as claimed in claim 1, wherein the pn junction is substantially parallel to three faces of the rib.

3. The device as claimed in claim 1, wherein the first and second doped regions each comprise respective first and second parts, the respective first parts comprising a relatively higher concentration of dopants than the respective second parts.

4. The device as claimed in claim 3, wherein said pn junction is formed between the respective second parts of the first and second doped regions.

5. The device as claimed in claim 3, wherein the first parts are connected to respective electrical connections, for applying an electrical potential difference across the pn junction.

6. The device as claimed in claim 1, wherein the light-carrying material is silicon.

7. The device as claimed in claim 1, wherein at least one of said faces of the rib is substantially flat.

8. The device as claimed in claim 1, providing data modulation of the optical signal with data rate up to 40 Gb/s.

9. The device as claimed in claim 1, wherein the first dopant is n-type dopant selected from phosphorus, antimony or arsenic.

10. The device as claimed in claim 1, wherein the second dopant is p-type dopant boron.

11. The device as claimed in claim 1, providing electro-optic bandwidth above 50 GHz.

12. A method of fabricating an electro-optic device, comprising:
   depositing a mask over an area of light-carrying material and partially etching parts of the light-carrying material not covered by the mask, to form thereby a layer of light-carrying material and a rib, projecting from the layer of light-carrying material, for guiding optical signals propagating through the device, said area of light-carrying material comprising a first doped region of a first type and a second doped region of a second, different type, at least partially overlaying the first doped region; and
   doping a side portion of the rib, abutting said mask, with dopants of said second type, such that said second doped region is extended and a pn junction is formed within the rib substantially parallel to at least two contiguous faces of the rib.

13. The method as claimed in claim 12, further comprising:
   doping a second side portion of the rib, abutting said mask, with dopants of said second type, such that said pn junction is formed substantially parallel to three faces of the rib.

14. The method as claimed in claim 12, further comprising:
   within the first and second doped regions, and on opposing sides of the rib, forming respective regions of higher doping concentration.

15. The method as claimed in claim 14, further comprising:
   forming respective electrical contacts with said regions of higher doping concentration.

16. The method as claimed in claim 12, wherein at least one of said faces of the rib is substantially flat.

17. The method as claimed in claim 12, wherein the light-carrying material is silicon.

18. The method as claimed in claim 12, further comprising: using the mask as a guide for both the etching process to define the waveguide rib, and the doping process to form the pn junction within the waveguide rib thus providing a self-aligned fabrication process, increasing yield.

* * * * *